United States Patent
Monk et al.

(10) Patent No.: US 6,475,698 B2
(45) Date of Patent: Nov. 5, 2002

(54) POLYMERIC COMPOUNDS

(75) Inventors: Alan Stanley Monk, Cheshire (GB); James Laurence Mulligan, West Yorkshire (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 60 days.

(21) Appl. No.: 09/726,347

(22) Filed: Dec. 1, 2000

(65) Prior Publication Data

US 2001/0019809 A1 Sep. 6, 2001

Related U.S. Application Data

(63) Continuation of application No. PCT/GB99/01731, filed on Jun. 2, 1999.

(30) Foreign Application Priority Data

Jun. 3, 1998 (GB) .............................................. 9811813

(51) Int. Cl.$^7$ ................................................ G03F 7/004
(52) U.S. Cl. ............................... 430/270.1; 430/283.1; 524/530; 524/553; 525/205; 525/282
(58) Field of Search ........................... 430/270.1, 283.1; 524/530, 553; 525/205, 282

(56) References Cited

U.S. PATENT DOCUMENTS

| | | | | |
|---|---|---|---|---|
| 5,576,143 A | * | 11/1996 | Aoai et al. ............... | 430/270.1 |
| 5,910,392 A | * | 6/1999 | Nozaki et al. ........... | 430/270.1 |
| 6,063,543 A | * | 5/2000 | Hien et al. ............... | 430/270.1 |
| 6,143,472 A | * | 11/2000 | Sumnio et al. .......... | 430/283.1 |
| 6,165,672 A | * | 12/2000 | Jung et al. ............... | 430/270 |
| 6,306,990 B1 | * | 10/2001 | Hein et al. ............... | 526/272 |

* cited by examiner

*Primary Examiner*—Janet Baxter
*Assistant Examiner*—Amanda C. Walke
(74) *Attorney, Agent, or Firm*—Baker Botts LLP

(57) ABSTRACT

Polymeric compounds for lithographic printing plates, especially plates for use in printing utilizing UV curable inks, may include a structural unit (I)

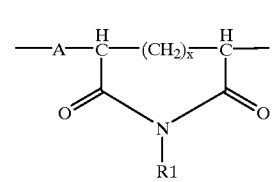

wherein $R^1$ represents an optionally-substituted cyclic or alkyl group, x represents 0 or 1 and A represents an optionally-substituted alkylene group. A range of compounds having different solubilities in selected solvents may be prepared by varying the identity or group $R^1$. Such components may be prepared by reacting an amine of formula $R^1NH_2$ with the maleic anhydride derivative corresponding to moiety 1.

11 Claims, No Drawings

POLYMERIC COMPOUNDS

CROSS-REFERENCE TO RELATED APPLICATIONS

This application is a continuation of international application Ser. No. PCT/GB99/01731 filed Jun. 2, 1999, which international application was published by the International Bureau in English on Dec. 9, 1999 and claims priority from Application GB 9811813.6, which was filed on Jun. 3, 1998.

This invention relates to polymeric compounds and particularly, although not exclusively, relates to polymeric compounds which incorporate an N-substituted cyclic imide moiety. Compounds of the invention may be used in radiation sensitive layers of printing members, especially lithographic printing plates or in radiation sensitive layers used in the manufacture of electronic parts such as printed circuits.

Lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophilic or oleophobic and image areas may be oleophilic. In "wet" lithographic printing, a dampening or fountain (water-based) liquid is applied initially to a plate prior to application of ink so that it adheres to the non-image areas and repels oil-based inks therefrom. In "dry" printing, ink is repelled from non-image areas due to their release property.

A conventional lithographic printing member precursor has a light sensitive coating over an aluminium support. Negative working lithographic printing member precursors have a radiation sensitive coating which when imagewise exposed to light hardens in the exposed areas. On development, the non-exposed areas of the coating are removed leaving the image. On the other hand, positive working lithographic printing member precursors have a radiation sensitive coating which, after imagewise exposure to light, has exposed areas which are more soluble in a developer than non-exposed areas. This light induced solubility differential is called photosolubilisation. A large number of commercially available positive working printing member precursors coated with quinone diazides together with a phenolic resin work by photosolubilisation to produce an image. In both cases the image area on the printing member itself is ink-receptive or oleophilic and the non-image area or background is water receptive or hydrophilic for use in "wet" printing or oleophobic for use in "dry" printing.

Recent developments in the field of lithographic printing member precursors have included the use of radiation sensitive compositions which can be imaged directly using a laser. Advantageously, digital imaging information can be used to image the precursor without the need to use an imaging master such as a photographic transparency. Examples of such compositions are provided in PCT Publication No. WO97/39894.

In addition to quinone diazides/phenolic resins, conventional positive working light sensitive compositions may include minor amounts of additives which are arranged to cause small changes in selected properties of the compositions.

Additives have been used to address problems associated with radiation sensitive coatings of UV printing plates. UV printing plates are plates which utilise an ink ("UV ink") containing an ultraviolet absorber.

UV printing plates must use radiation sensitive compositions which are not substantially susceptible to attack by UV inks or any press chemicals associated with UV inks. For example, such compositions should be substantially insoluble in UV inks and substantially insoluble in solvents, often glycol ethers, used to clean the plates during a print run or after one print run and prior to another. Conventional quinone diazide/phenolic resin based radiation sensitive compositions are highly soluble in glycol ether solvents and, accordingly, cannot be used for UV printing plates.

Another problem that needs to be addressed in relation to many types of radiation sensitive compositions is that of ensuring that they are not substantially soluble in the founts (or dampening liquids) which are used to wet the hydrophilic areas of the plates. Traditionally founts are largely comprised of water and a small amount of alcohol. More recently, such founts have been replaced, in some situations, with formulations comprising alternative additives to water in order to remove inflammable alcohol solvents from press room environments. Additives that have been used include surfactants and other non-volatile solvents which can be more aggressive towards the compositions. Conventional radiation sensitive compositions are relatively susceptible to attack by the replacement founts and, accordingly, steps must be taken to reduce such susceptibility by using additives and/or different resins in the compositions.

Various additives and/or novel resins have been proposed for addressing the above described problems. However, often the additives/resins proposed are made by complicated and/or difficult and/or unversatile chemistry which limits their commercial application.

The types of electronic parts whose manufacture may use a radiation sensitive composition include printed wiring boards (PWBs), thick-and thin-film circuits, comprising passive elements such as resistors, capacitors and inductors; multichip devices (MDCs); integrated circuits (ICs); and active semiconductor devices. The electronic parts may suitably comprise conductors, for example copper board; semiconductors, for example silicon or germanium; and insulators, for example silica as a surface layer with silicon beneath, with the silica being selectively etched away to expose portions of the silicon beneath (a step in the manufacture of e.g. field effect transistors).

This invention is based upon the discovery of a novel process for preparing polymeric compounds and novel compounds per se. The process is simple and highly versatile in allowing polymeric compounds to be produced having a wide range of desirable properties.

Thus, the object of the present invention is to provide a process and/or compounds which may be advantageous over the prior art.

According to a first aspect of the invention, there is provided a lithographic printing member precursor which includes a polymeric compound, suitably in a first layer of the printing member, having the structural unit

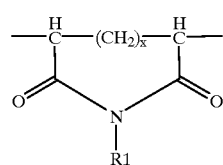

wherein $R^1$ represents an optionally-substituted cyclic or alkyl group and x represents 0 or 1.

According to a second aspect of the invention, there is provided a process for the preparation of a polymeric compound which process includes preparing a polymeric compound having the structural unit I described above by treating a polymeric compound having the structural unit

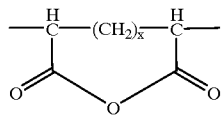

II with an amine of formula $R^1NH_2$ and optionally derivatising said compound having the structural unit I, wherein, in units I and II, $R^1$ represents an optionally-substituted cyclic or alkyl group and x represents 0 or 1.

It has been found that the identity of the unit I affects the solubility of polymeric compounds incorporating the unit to a significant degree. Advantageously, the process can be used to produce compounds having varying degrees of solubility in solvents used in lithographic, especially UV, printing. Thus, according to a third aspect, the invention provides a process for the preparation of a polymeric compound which process includes preparing a polymeric compound having the structural unit I as described above for a printing member precursor, especially a lithographic printing member precursor, the process including the step of selecting an amine of formula $R^1NH_2$ as described above to give when reacted with a polymeric compound have a structural unit II as described above, and optionally derivatised, the desired resistance to a solvent used in printing; treating said compound having the structural unit II with said amine to yield a compound having the structural unit I; and optionally derivatising said compound having the structural unit I.

Unless otherwise stated in this specification, an alkyl or alkenyl group (whether alone or as part of another functional group, for example an alkoxy group) may be linear or branched and may have up to 20, suitably up to 16, preferably up to 12, more preferably up to 8, especially up to 4 carbon atoms.

Unless otherwise stated in this specification, a cyclic group may be alicyclic, aromatic or heterocyclic. Preferred groups are monocyclic. Preferred groups have five or, preferably, six ring atoms. An alicyclic group may be a cycloparaffin, a cycloolefin or a cycloacetylene. Of these, it is preferably a cycloparaffin with cyclohexane and cyclopentane being especially preferred. Preferred aromatic groups are phenyl and naphthyl groups with phenyl being especially preferred. Heterocyclic groups may include ring atoms selected from nitrogen, oxygen and sulphur and may have one or more rings which may be fused rings. Preferred heterocyclic groups include pyridyl, thiophenyl and furanyl groups.

Where any group is stated to be optionally-substituted, it may be substituted by one or more moieties selected from halogen atoms, especially chlorine and bromine atoms; hydroxy, nitro, carboxy, amino, cyano and sulphonic acid groups; and optionally substituted, especially unsubstituted, alkyl, alkenyl, alkoxy, sulphonamide, especially —$SO_2NH_2$, acyl, acyloxy, alkoxycarbonyl and N-alkylcarbamoyl groups.

Said polymeric compound having said structural unit I may include a structural unit

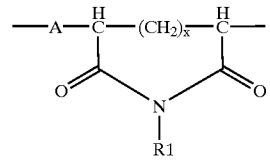

III wherein A in said unit III represents a unit I, a unit II, an optionally-substituted alkylene group, a unit of formula

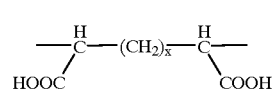

V or a derivative of a unit of formula V, wherein one or both of the carboxylic acid groups are esterified.

Said compound having the structural unit III may be prepared by treating a compound having the structural unit

IV with said amine of formula $R^1NH_2$ and optionally derivatising said compound having the structural unit III wherein $R^1$ and x are as described above; and A in said unit IV represents a unit II, an optionally-substituted alkylene group, a unit V or a said derivative thereof.

Polymeric compounds having the units II or IV are commercially available or may be prepared by standard techniques. Compounds of formula III wherein A represents a unit of formula V or a derivative may be prepared by hydrolysis and optional esterification of a maleic anhydride unit.

Preferably, in both said units III and IV, A represents an optionally-substituted alkylene group.

Group A suitably represents an optionally-substituted $C_{1-10}$, preferably a $C_{1-6}$, more preferably a $C_{1-4}$, especially a $C_2$ alkylene group. Preferably, two or more optional-substituents of a said alkylene group do not together form a part of an aliphatic cyclic hydrocarbon; that is, carbon atoms in the alkylene group A do not form a part of an aliphatic cyclic hydrocarbon structure.

Optional-substituents of said group A may be selected from a halogen atom, a hydroxy group or an optionally-substituted alkyl, alkoxy or phenyl group. Preferably, optional substituents of said group A are selected from optionally-substituted alkyl, alkoxy and phenyl groups. More preferably, optional substituents of said group A are selected from optionally-substituted, especially unsubstituted, alkoxy and phenyl groups. Suitably, a said alkoxy group is a $C_{1-6}$, preferably a $C_{1-4}$, more preferably a $C_{1-2}$, especially methoxy, group.

Preferably, group A is unsubstituted or substituted by only one substituent. More preferably, A is monosubstituted and suitably represents a vinyl moiety. A is preferably not substituted by an imide-containing group.

Preferably, group A is of general formula —$CHR^4CH_2$— wherein $R^4$ represents a hydrogen atom or an optional substituent as described above.

Preferably, x represents 0.

Where $R^1$ represents an optionally-substituted cyclic group, said cyclic group may be alicyclic, aromatic or heterocyclic. It is preferably alicyclic or aromatic.

A said alicyclic group is suitably selected from a cycloalkyl, a cycloalkenyl or a cycloalkynyl group. Preferred alicyclic groups have 5 or 6, especially 6, ring atoms. An alicyclic group may be selected from a cycloalkyl and a cycloalkenyl group. It is suitably a cycloalkyl group, with cyclopentyl and cyclohexyl being preferred. Of these, cyclohexyl is especially preferred.

A preferred aromatic group is a phenyl group.

Where said group $R^1$ represents an optionally-substituted alkyl group, said alkyl group may have up to 20, preferably up to 16, more preferably up to 12, carbon atoms.

Where said group $R^1$ is optionally-substituted, optional substitutents may be selected from hydroxy; optionally-substituted alkoxy, hydroxyalkyloxy and —$SO_2NR^2R^3$ groups, where $R^2$ and $R^3$ independently represent a hydrogen atom or an alkyl group, especially a hydrogen atom; functional groups containing a radiation sensitive atom or group; functional groups which increase the heat sensitivity of said polymeric compound prepared in the process; dye-containing groups; groups which include an ethylenically-unsaturated double bond, for example an acrylate; groups that may aid the adhesion of said polymeric compound prepared in the process to a substrate, for example of a printing plate. Examples of some of said functional groups described are provided hereinafter in the context of the derivatisation of a compound having the structural unit I.

Preferred optional substituents of said group $R^1$ are hydroxy and optionally-substituted alkoxy, hydroxyalkyl and —$SO_2NR^2R^3$ groups as described. Especially preferred optional substituents are hydroxy and —$SO_2NR^2R^3$ groups.

Where $R^1$ represents a substituted phenyl group, it is preferably substituted in the 4-position.

$R^1$ may be substituted by one or more substituents as described above. Preferably, $R^1$ is unsubstituted or substituted by only one atom or group.

Said compound having the structural unit II is preferably a co-polymer. It may have a molecular weight of at least 1,000, suitably at least 2,000, preferably at least 10,000, especially at least 100,000. The molecular weight may be less than 500,000, suitably less than 400,000, preferably less than 300,000, more preferably less than 200,000. In one embodiment the molecular weight may be in the range 1,000 to 2,500; in another embodiment, the molecular weight may be in the range 100,000 to 500,000.

The processes described herein may easily be used to produce polymeric compounds having at least two different structural units of formula I, by treating a said polymeric compound having at least two structural units II with at least two amine compounds of formula $R^1NH_2$. For example, in one embodiment described hereinafter, cyclohexylamine and sulphanilamide may be reacted with a compound having the structural unit II. By using at least two amines and optionally varying the amounts thereof as described, there is provided a further means of adjusting the solubility of the copolymers prepared. Accordingly, the invention extends to a process for preparing a polymeric compound having at least two different structural units of formula I by treating a polymeric compound having at least two structural units II with at least two different amine compounds of formula $R^1NH_2$. The invention also extends to a polymeric compound having at least two different structural units of formula I.

A said polymeric compound described herein is preferably substantially insoluble at 25° C. in one or more, preferably at least two, more preferably at least 3, of the following solvents: toluene, water, ethanol, chloroform, tetrahydrofouran and methylethylketone. Suitably, less than 200 g/l, preferably less than 100 g/l, more preferably less than 50 g/l, especially less than 10 g/l of a said polymer compound is soluble in one or more of the aforesaid solvents.

In the process described herein, a said compound having the structural unit II is suitably provided in a solvent, especially an aprotic organic solvent, for example a pyrrolidone solvent. Said amine compound(s) may then be added to the mixture and suitably dissolved. A catalyst which may be a base, for example a pyridine, or an acid, for example acetic acid, may be added and the reaction subsequently carried out at an elevated temperature. The reaction mixture may be allowed to cool and left for a time. Subsequently it may be poured into acidified water to cause the desired product to precipitate. The precipitate may be isolated by standard techniques.

Said compound having structural unit I may be derivatised to yield a derivative which may also be of use in printing. For example, said compound may be derivatised so that it incorporates other components which are included in radiation and/or heat sensitive compositions of printing members. For example, said compound may be derivatised by reaction with a compound containing a radiation sensitive atom or group; functional groups which increase the heat sensitivity of said polymeric compound prepared in the process; a dye containing group; a group which includes an ethylenically-unsaturated double bond, for example an acrylate; or a group that may aid the adhesion of said polymeric compound prepared in the process to a substrate of a printing plate. Advantageously, said group $R^1$ may incorporate or be derivatised so that it incorporates said other components described above.

Where said compound of formula I or a said derivative thereof includes an ethylenically-unsaturated double bond, such a compound may thereby be adapted to react with another unsaturated compound on exposure to imaging radiation. Such an arrangement may be used in a negative-working radiation sensitive composition. For example, in one embodiment, said compound of formula I, especially group $R^1$ thereof, or a said derivative may be arranged to react in a Diels-Alder cycloaddition reaction, for example, by incorporating a group

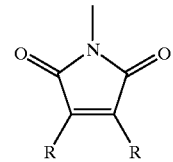

wherein R represents a hydrogen atom or an optionally-substituted alkyl group and a said negative-working composition may include another moiety with which said group may react in a said Diels-Alder reaction.

Where said compound of formula I is derivatised, it is suitably derivatised using a compound (hereinafter "said derivatising compound") containing a radiation sensitive atom or group or comprising functional groups which increase the heat sensitivity of the polymeric compound prepared in the process.

In one embodiment, said derivatising compound includes a diazide functional group and may suitably include a quinone diazide moiety, for example a naphthoquinone diazide (NQD) moiety or a benzoquinone diazide (BQD) moiety. Examples of quinone diazide moieties include

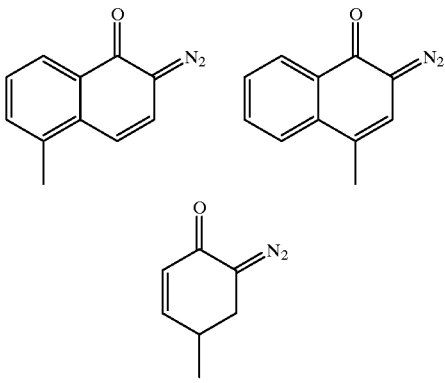

A quinone diazide moiety is hereinafter referred to by the letter $Q^1$.

In another embodiment, said derivatising compound may include a functional group $Q^2$ which represents a moiety which may hydrogen bond to other parts of the same molecule or an adjacent molecule or molecules. Thus, where such a derivatising compound is used, said polymeric compound prepared may be heat sensitive in that imagewise heated areas can define an image relative to non-heated areas.

Preferably, $Q^2$ represents a group of formula —T—Z where T represents a moiety which can hydrogen bond to other moieties and Z represents a further moiety which may or may not hydrogen bond to other moieties.

Suitably $Q^2$ represents a group of formula —O—$T^1$—Z where $T^1$ is a moiety which can hydrogen bond to another moiety of the same molecule or an adjacent molecule or molecules. Suitably, $T^1$ represents a carbonyl group, a sulphinyl group or a sulphonyl group. Preferably it represents a carbonyl or, especially, a sulphonyl group.

A moiety Z may for example be an optionally substituted alkyl, alkenyl, alkynyl, cycloalkyl, aryl, heteroaryl, non-aromatic heterocyclic, aralkyl or heteroaralkyl group.

Preferably the moiety Z is an optionally substituted aryl, heteroaryl or alkyl group. An especially preferred aryl group is a phenyl or naphthyl group optionally substituted by 1–3 moieties independently selected from hydroxy, halo, $C_{1-4}$ alkyl (especially methyl), $C_{1-4}$ haloalkyl (especially $CF_3$), $C_{1-4}$ alkoxy (especially methoxy), amino, mono-($C_{1-4}$ alkyl) amino (especially methylamino), and di-($C_{1-4}$ alkyl)amino (especially dimethylamino). An especially preferred aryl group is a naphthyl group, a dansyl group, a phenyl group or a 4-methylphenyl group. An especially preferred optionally substituted alkyl group is a $C_{2-8}$ alkyl group, especially an n-$C_{3-6}$ alkyl group.

Preferably, $Q^2$ is selected from —O—$SO_2$-tolyl, —O—dansyl, —O—$SO_2$-thienyl, or —O—$SO_2$-naphthyl and —O—CO—Ph.

Where said compound of formula I is derivatised, the compound having the structural unit I may be treated with a compound of formula $Q(X)_pL$ (VI) where Q consists of or includes the desired functional group and may be $Q^1$ or $Q^2$ described above, X is a linking atom of group, p is 0 or 1 and L is a leaving group.

X may be any group which is suitably unreactive under the conditions under which the derivatisation reaction is carried out. For example, X may be an optionally-substituted alkynyl group, a group —COO— or a group —$OSO_3$—. A said group —$OSO_3$— is especially preferred. p is preferably 1.

L may be any suitable leaving group. For example, it may be a hydrogen or a halogen atom. Suitable halogen atoms are fluorine, chlorine and bromine atoms, with chlorine being especially preferred.

A preferred compound of formula VI is of formula Q—$OSO_3$—Cl.

Said compound of formula VI may react at any suitable site of said compound having the structural unit I. For example, it may react with a suitable functional group, for example an hydroxy group, of moiety A (when provided) or of group $R^1$. Preferably, it reacts with a functional group of said group $R^1$. For example, $R^1$ may represent an optionally-substituted phenyl group in said compound having the structural unit I and such a group may be derivatised in an esterification reaction, for example by a compound of formula Q—$OSO_3$—Cl.

Each structural unit I of said polymeric compound prepared as described above need not be derivatised as aforesaid. By varying the relative amounts of the compound containing structural unit I and the compound used to derivatise said compound, the number of unit I of said compound which are derivatised may be varied which thereby provides a further means of varying the properties of the polymeric compounds produced according to the present invention.

In the process described herein, the compound having the structural unit I may be isolated prior to said optional derivatisation or a derivatisation reaction may be carried out without said compound having the structural unit I being isolated.

Preferably, in the process described herein, said polymeric compound prepared has the structural unit I; that is, said unit I is preferably not derivatised.

Preferably, the polymeric compound prepared in the process described herein is a copolymer. Preferably, said polymeric compound does not include groups susceptible to hydrolysis reactions under ambient conditions since the presence of such groups may affect the shelf-life of the polymers.

According to a fourth aspect of the present invention, there is provided a novel polymeric compound having the structural unit I or a derivative thereof, as described herein.

According to a fifth aspect of the present invention, there is provided a precursor for preparing a resist pattern, said precursor including a first layer which includes a polymeric compound as described herein or when prepared in a process as described herein.

Said first layer of said first or said fourth aspect is preferably a radiation and/or heat sensitive layer which is arranged to be exposed to imaging radiation and/or heat, followed by optional development, to provide a resist pattern.

Said first layer may include one or more polymeric compounds according to said first, second, third and/or fourth aspects.

In one embodiment, said first layer may comprise an oleophilic heat-sensitive composition as described in any statement in PCT Publication No WO97/39894 the whole contents of which are incorporated herein by reference. Thus, said heat-sensitive composition preferably comprises an aqueous developer soluble polymeric substance and a compound which reduces the aqueous developer solubility of the polymeric substance wherein the aqueous developer solubility of the composition is increased on heating and the aqueous developer solubility of the composition is not increased by incident UV radiation. Said aqueous developer soluble polymeric substance may be provided by a said polymeric compound according to the first, second, third and/or fourth aspects of the present invention. Preferably, however, the composition includes an aqueous developer soluble polymeric substance outside the scope of the first, second, third and/or fourth aspects and a said polymeric compound according to said first, second, third and/or fourth aspects. Preferably, the aqueous developer soluble polymeric substance comprises a functional group or groups selected from hydroxy, carboxylic acid, amino, amide and maleiimide. More preferably, the aqueous developer soluble polymeric substance is selected from a polymer or copolymer of hydroxystyrene, a polymer or copolymer of acrylic acid, a polymer or copolymer of methacrylic acid, a polymer or copolymer of maleiimide, a polymer or copolymer of maleic anhydride, a hydroxycellulose, a carboxy cellulose and a phenolic resin. Preferably, the compound which reduces the aqueous developer solubility of the polymeric substance is a compound which comprises at least one nitrogen atom which is quaternized and/or incorporated into a heterocyclic ring; a triarylmethane compound; a compound having a carbonyl functional group; a compound of general formula

$$Q_3\text{—}S(O)_a\text{—}Q_4$$

where $Q_3$ represents an optionally-substituted phenyl or alkyl group, a represents 0, 1 or 2 and $Q_4$ represents a halogen atom or an alkoxy group; or a ferrocenium compound. More preferably, said compound which reduces the aqueous developer solubility of the polymeric substance is selected from a quinoline compound, a triazole compound, a imidazoline compound, a quinolinium compound, a benzothiazolium compound, a pyridinium compound, a flavone compound, ethyl-p-toluene sulphonate, p-toluenesulphonyl chloride and acridine orange base (CI solvent orange 15).

The amount of compounds according to said first, second, third and/or fourth aspects incorporated is suitably dependent upon the intended application in said first layer. In one embodiment, which may suitably be for use in a UV printing member, the sum of the amounts of polymeric compounds according to said first, second, third and/or fourth aspects may represent at least 20 wt %, preferably at least 30 wt %, more preferably at least 40 wt %, especially at least 45 wt % of said layer. Said sum may be less than 90 wt %, suitably less than 80 wt %, preferably less than 70 wt %, more preferably less than 60 wt %, especially less than 55 wt %. In this case, said layer may include a second compound which is preferably a radiation sensitive compound and, optionally, a third compound which may be a polymeric compound (outside the scope of the present invention). A said second compound may suitably include a diazide functional group as described above. Said second compound is preferably polymeric. Examples of suitable second compounds include NQD esters of resins, for example an NQD ester of pyrogallol-acetone condensate. A said third compound may also be a radiation sensitive compound, suitably having a diazide functional group as described above. Preferably, however, a said third compound is not polymeric.

In another embodiment, said polymeric compounds according to the first, second, third and/or fourth aspects may be present in a minor amount in said radiation sensitive layer. In this case, said radiation sensitive layer may be for a conventional printing plate, with a said polymeric compound suitably being an additive. A minor amount in the context of the present specification is preferably less than 20 wt %, more preferably less than 15 wt %, especially less than 10 wt %.

Said radiation sensitive layers may include other conventional components, for example surfactants, colourants, colour change dyes, acid generators and the like.

Said radiation sensitive layers are preferably positive working.

Said printing member precursor suitably includes a support over which said radiation sensitive layer is provided.

Said support may be arranged to be non-ink-accepting when for use in lithographic printing. Said support may have a hydrophilic surface for use in conventional lithographic printing using a fount solution or it may have a release surface suitable for use in waterless printing.

Said support may comprise a metal layer. Preferred metals include aluminium, zinc and titanium, with aluminium being especially preferred. Said support may comprise an alloy of the aforesaid metals. Other alloys that may be used include brass and steel, for example stainless steel.

Said support may comprise a non-metal layer. Preferred non-metal layers include layers of plastics, paper or the like. Preferred plastics include polyester, especially polyethylene terephthlate. Said support may be treated to define a said hydrophilic or release surface.

The support may be a semiconductor or, preferably, a conductor in the context of electronic circuitry, and in the context of lithography may be an aluminium plate which has undergone the usual anodic, graining and post-anodic treatments well known in the lithographic art for enabling a radiation sensitive composition to be coated thereon and for the surface of the support to function as a printing background. Another support for use in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated can be used.

Said support may be any type of support usable in printing. For example, it may comprise a cylinder or, preferably, a plate.

Said precursor of said fifth aspect may be for the manufacture of an electronic part. The types of electronic parts whose manufacture may use a heat sensitive coating include printed wiring boards (PWBs), thick- and thin-film circuits, comprising passive elements such as resistors, capacitors and inductors; multichip devices (MDCs); integrated circuits (ICs); and active semi-conductor devices. The electronic parts may suitably comprise conductors, for example copper board; semi-conductors, for example silicon or germanium; and insulators, for example silica as a surface layer with silicon beneath, with the silica being selectively etched away to expose portions of the silicon beneath (a step in the manufacture of e.g. field effect transistors).

Said precursor is preferably a lithographic printing plate precursor.

Said precursor may include another layer, for example comprising a release material, over the first layer.

The invention extends to a method of preparing a precursor as described herein the method comprising forming a first layer which includes a polymeric compound having the structural unit I or a compound prepared in a process as described herein over a support.

The invention extends to a method of preparing a lithographic printing member precursor comprising selecting a polymeric compound having desired solubility characteristics in solvents to which the printing member is subjected in use and forming a first layer which includes said polymeric compound over a support.

According to a sixth aspect, there is provided a printing member having printing and non-printing areas wherein said printing areas include a polymeric material (suitably in a first layer) having the structural unit I or a compound prepared in a process as described herein.

Any feature of any aspect of any invention or embodiment described herein may be combined with any feature of any aspect of any other invention or embodiment described herein.

The invention will now be described, by way of example.

The following products are referred to hereinafter:

Gantrez AN119—a linear methyl vinyl ether/maleic anhydride copolymer obtained from ISP of New Jersey, U.S.A. having a specific viscosity of 0.1 to 0.5 (1% in methylethyl ketone at 25° C.), a molecular weight of 190,000 and a structure as shown below.

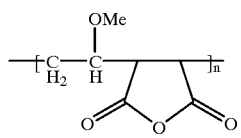

Styrene/maleic anhydride (1:1) copolymer—a cumene terminated poly(styrene-co-maleic anhydride) (CAS No. 26762-29-8) having an average molecular weight of 1600 and a styrene to maleic anhydride ratio of 1.3:1.0 obtained from Aldrich Chemical Company, Gillingham, UK.

Styrene/maleic anhydride (2:1) copolymer—as per the above, but having a molecular weight of 1700 and a ratio of 2.0:1.0.

Styrene/maleic anhydride (3:1) copolymer—as per the above, but having a molecular weight of 1900 and a ratio of 2.85 to 1.0.

Posylux 2521—a 2,1,5-NQD ester of pyrogallol-acetone condensate available from Produit Chimiques Auxiliaries et de Synthese (PCAS) Z. I. Vigne aux Loups BR181, 91161 Longjumeau, France.

2,1,5-NQD dihydroxybenzophenone obtained from A. H. Marks, Wyke, Bradford, England.

Basonyl Blue 633—a pH colour change dye obtained from BASF, Cheadle, UK.

C5060 blanket wash—a formulation supplied by Anchor Chemicals of Jacksonville, Fla. used for cleaning UV inks from printing press blankets. It contains glycol ethers such as methyoxypropan-2-ol and methoxypropoxypropanol.

Multiwash—a formulation supplied by Varn Chemicals of Manchester, England used for cleaning UV inks from printing press blankets. It also is believed to contain glycol ethers.

LB6564 Resin—a phenol/cresol novolak resin marketed by Bakelite, UK believed to have the structure:

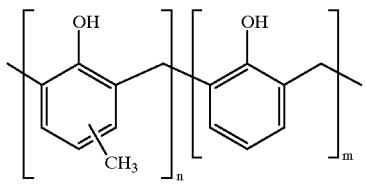

wherein n=m;

LB744 Resin—a cresol novolak resin marketed by Bakelite, UK believed to have the structure:

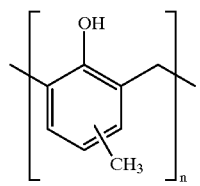

KF654B PINA—a dye as supplied by Riedel de Haan UK, Middlesex, UK, believed to have the structure:

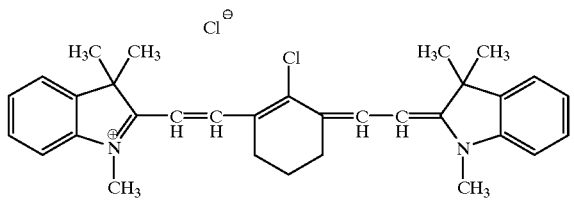

Crystal violet (basic violet 3,C.I.42555, Gentian Violet) as supplied by Aldrich Chemical Company of Dorset, UK, having the structure:

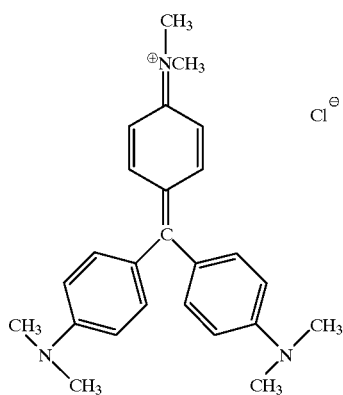

Silikophen P50X—a phenyl methyl siloxane as supplied by Tego Chemie Service GmbH of Essen, Germany.

Emerald Euro S4—an alcohol replacement fount obtained from Anchor Chemicals of Jacksonville, Fla.

EXAMPLE 1

Preparation of N-(p-phenylsulphonamide)-Substituted (Methyl Vinyl Ether/Maleimide) Copolymer (Compound 1)

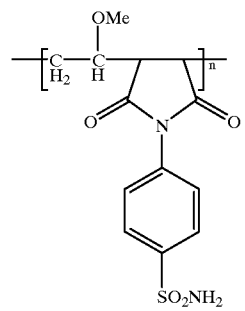

A 20 wt % solution of Gantrez AN119 was prepared using anhydrous n-methylpyrrolidone (NMP). A sample of the solution (156 g) was placed in a beaker and dissolved in anhydrous NMP (300 g). Once dissolved, p-aminobenzenesulphonamide (hereinafter referred to as "sulphanilamide") (34.46 g) was added and dissolved by stirring. Then, dimethylaminopyridine (0.2 g) was dissolved in the solution. After stirring for 45 minutes at ambient temperature, the solution was heated to 90–95° C. by immersion in a hot water bath for 1 hour. The mixture was allowed to cool and left to stand overnight.

A 3 liter beaker containing 2 liters of distilled water containing 10 ml of concentrated hydrochloric acid was stirred. The reaction mixture was very slowly poured into the stirring water as a thin stream causing the desired product (Compound 1) to precipitate as a tan-pink suspension. The mixture was stirred for 2 hours and then allowed to settle. The mixture was filtered and re-suspended in a further 2 liters of water for 2 hours before filtering and drying in a fan oven overnight to form dark brown granules (48.4 g; 78.0%).

FTIR Analysis of the compound prepared shows the presence of the imide C—N—C stretch showing that a cyclic imide is present. A very weak peak also shows the presence of N—H groups of an amide group suggesting the presence of a hydrolysed or non-ring closed product present in a trace amount.

Compounds 2 to 10 were prepared from the reagents detailed below, following generally the procedure described in Example 1. It should be noted that compounds 1 and 2 were made using base catalysed reactions whereas compounds 3 to 10 were made using acid catalysed reactions.

Compound 2: N-(p-hydroxyphenyl)-substituted (methyl vinyl ether/maleimide) copolymer.

| Reagents | Weight (g) | Moles |
| --- | --- | --- |
| Gantrez AN119 | 39.03 | 0.25 |
| p-aminophenol | 27.3 | 0.25 |
| n-methylpyrrolidone | 300 | 3.02 |
| dimethylaminopyridine | 0.4 | — |

Yield 84.7%

Compound 3: N-(p-phenylsulphonamide)-substituted (styrene-maleimide (1:1)) copolymer.

| Reagents | Weight (g) | Moles |
| --- | --- | --- |
| Styrene/maleic anhydride (1:1) copolymer | 11.67 | 0.05 |
| Sulphanilamide | 8.62 | 0.05 |
| n-methylpyrrolidone | 24 | 0.25 |
| acetic acid (glacial) | 30.03 | 0.5 |

Yield 90.3%

Compound 4: N-(p-phenylsulphonamide)-substituted (styrene-maleimide (2:1)) copolymer.

| Reagents | Weight (g) | Moles |
| --- | --- | --- |
| Styrene/maleic anhydride (2:1) copolymer | 15.32 | 0.05 |
| Sulphanilamide | 8.62 | 0.05 |
| n-methylpyrrolidone | 24.8 | 0.25 |
| acetic acid (glacial) | 30.03 | 0.5 |

Yield 93.2%

Compound 5: N-(p-phenylsulphonamide)-substituted (styrene-maleimide (3:1) copolymer.

| Reagents | Weight (g) | Moles |
| --- | --- | --- |
| Styrene/maleic anhydride (3:1) copolymer | 19.74 | 0.05 |
| Sulphanilamide | 8.62 | 0.05 |
| n-methylpyrrolidone | 24.8 | 0.25 |
| acetic acid (glacial) | 30.03 | 0.5 |

Yield 95.2%

Compound 6: N-(p-sulphonamide)-substituted (methyl vinyl ether/maleimide) copolymer.

| Reagents | Weight (g) | Moles |
| --- | --- | --- |
| Gantrez AN119 | 15.61 | 0.1 |
| Sulphanilamide | 17.23 | 0.1 |
| n-methylpyrrolidone | 46.8 | 0.47 |
| acetic acid (glacial) | 46.83 | 0.75 |

Yield 67.7%

Compound 7: N-(p-aminophenol)-substituted (methyl vinyl ether/maleimide) copolymer.

| Reagents | Weight (g) | Moles |
| --- | --- | --- |
| Gantrez AN119 | 15.61 | 0.1 |
| p-aminophenol | 10.92 | 0.1 |
| n-methylpyrrolidone | 46.8 | 0.47 |
| acetic acid (glacial) | 46.83 | 0.75 |

Yield 75.2%

Compound 8: a mixed N-(p-sulphonamide) and N-cyclohexyl-substituted (50:50) (methylvinyl ether/maleimide) copolymer.

| Reagents | Weight (g) | Moles |
| --- | --- | --- |
| Gantrez AN119 | 15.61 | 0.1 |
| Sulphanilamide | 8.62 | 0.05 |
| Cyclohexylamine | 4.91 | 0.05 |
| n-methylpyrrolidone | 46.8 | 0.47 |
| acetic acid (glacial) | 46.83 | 0.75 |

Yield 77.9%

Compound 9: a mixed sulphonamide and cyclohexyl substituted (25:75) (methyl vinyl ether/maleimide) copolymer.

| Reagents | Weight (g) | Moles |
|---|---|---|
| Gantrez AN119 | 15.61 | 0.1 |
| Sulphanilamide | 4.31 | 0.03 |
| Cyclohexylamine | 7.37 | 0.08 |
| n-methyl pyrrolidone | 46.8 | 0.47 |
| acetic acid (glacial) | 46.83 | 0.75 |

Yield 75.7%

Compound 10: a mixed N-(p-sulphonamide) and N-cyclohexyl-substituted (37.5:62.5) (methyl vinyl ether/maleimide)

| Reagents | Weight (g) | Moles |
|---|---|---|
| Gantrez AN119 | 15.61 | 0.1 |
| Sulphanilamide | 6.46 | 0.04 |
| Cyclohexylamine | 6.14 | 0.06 |
| n-methylpyrrolidone | 46.8 | 0.47 |
| acetic acid (glacial) | 46.83 | 0.75 |

Yield 75.4%

Compounds 11 to 23 were prepared in processes to that of Example 1, with the main reagents in Table 1 below.

TABLE 1

| Compound No | Polymer | Amine |
|---|---|---|
| 11 | Gantrez AN119 | aminoethanol |
| 12 | " | n-butylamine |
| 13 | " | methoxyethylamine |
| 14 | " | aminoethyoxyethanol |
| 15 | " | cyclohexylamine |
| 16 | " | n-dodecylamine |
| 17 | Styrene/maleic anhydride (1:1) | aminoethanol |
| 18 | Styrene/maleic anhydride (1:1) | p-aminophenol |
| 19 | Styrene/maleic anhydride (1:1) | n-butylamine |
| 20 | Styrene/maleic anhydride (1:1) | methoxyethylamine |
| 21 | Styrene/maleic anhydride (1:1) | aminoethyoxyethanol |
| 22 | Styrene/maleic anhydride (1:1) | cyclohexylamine |
| 23 | Styrene/maleic anhydride (1:1) | n-dodecylamine |

A summary of the structures of the compounds is Table 2 below.

TABLE 2

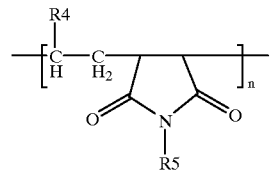

| Compound No. | $R^4$ | $R^5$ |
|---|---|---|
| 1 | —OCH$_3$ | para-(H$_2$NSO$_2$)-phenyl- |
| 2 | —OCH$_3$ | para-hydroxyphenyl- |
| 3 | -phenyl | para-(H$_2$NSO$_2$)-phenyl- |
| 4 | -phenyl | " |
| 5 | -phenyl | " |
| 6 | —OCH$_3$ | " |
| 7 | —OCH | para-hydroxyphenyl- |
| 8 | —OCH$_3$ | para-(H$_2$NSO$_2$)-phenyl- -and- cyclohexyl-(50:50) |
| 9 | —OCH$_3$ | para(H$_2$NSO$_2$)-phenyl- and cyclohexyl-(25:75) |
| 10 | —OCH$_3$ | para(H$_2$NSO$_2$)-phenyl- and cyclohexyl-(37.5:62.5) |
| 11 | —OCH$_3$ | hydroxyethyl- |
| 12 | —OCH$_3$ | n-butyl- |
| 13 | —OCH$_3$ | methoxyethyl- |
| 14 | —OCH$_3$ | hydroxyethyloxyethyl- |
| 15 | —OCH$_3$ | cyclohexyl- |
| 16 | —OCH$_3$ | n-dodecyl- |

EXAMPLE 2

Assessing Solubilities of Selected Compounds

The solubilities of selected compounds in selected solvents was determined by attempting to dissolve 3 g of a selected compound in 15 ml of solvent at ambient temperature. Results are provided in Table 3, where "I"=insoluble; "S"=soluble; "O"=opalescent.

TABLE 3

| Solvent | Compound | | | | | | | | | | | | | |
|---|---|---|---|---|---|---|---|---|---|---|---|---|---|---|
| | 11 | 7 | 12 | 13 | 14 | 15 | 16 | 17 | 18 | 19 | 20 | 21 | 22 | 23 |
| Toluene | I | I | I | I | I | I | S | I | I | I | I | I | I | S |
| Water | S | I | I | S | S | I | I | S | I | I | S | S | I | I |
| Ethanol | S | S | S | S | S | I | S | S | S | O | I | S | I |
| Chloroform | I | I | S | S | I | S | S | I | I | I | S | I | I | S |
| THF | I | I | S | I | I | S | S | I | I | S | S | I | I | S |
| Methylethyl-ketone | I | I | S | I | I | O | I | I | I | I | S | I | I | I |

The results in Table 3 show that the nature of the $R^5$ group significantly affects solubilities; and the nature of the $R^4$ group affects solubilities to a lesser extent.

EXAMPLE 3

Preparation and Assessment of Formulations

Positive-working radiation sensitive formulations were prepared by barrel rolling together for about 24 hours, 50 parts by weight of a selected compound prepared as described in Example 1, 50 parts by weight of Posylux 2521 and 1 part by weight of Basonyl Blue in 1-methoxy propan-2-ol solvent.

The formulations prepared (at 14.5 wt % solids content) were each coated onto an aluminium sheet that had been electrograined and anodized and post-anodically treated with an aqueous solution of an inorganic phosphate. The coatings were dried at 130° C. for 80 seconds to give a dry film weight of 1.5 g/m$^2$.

A 10×10 cm sample of each coated support was weighed and then submersed in C5060 blanket wash for 30 seconds followed by rubbing with cotton wool to remove loosely bound coating. After drying, the sample was reweighed and the weight loss calculated. Details of the compounds tested and the results are provided in Table 4.

TABLE 4

| Compound No. included in formulation | Weight loss (%) |
| --- | --- |
| 1 | 29 |
| 2 | 21 |
| 3 | 29 |
| 4 | 35 |
| 5 | 51 |
| 6 | 26 |
| 7 | 21 |
| 8 | 14 |
| 9 | 12 |
| 10 | 20 |

The above mentioned results may be compared with a commercially available positive working lithographic printing plate sold under the trade mark CAPRICORN GOLD by Horsell Anitec which, under the same test conditions, lost 100% of its weight. Additionally, a coating comprising approximately 100 wt % Posylux 2521 and a small amount of Basonyl dye lost 63% of its weight under the same conditions.

EXAMPLE 4

Preparation and Assessment of Formulation

A positive-working radiation sensitive formulation was prepared by barrel rolling together 50 parts of Compound 7, 62.5 parts of Posylux 2521, 5 parts of Compound 1, 7 parts of 2,1,5-NQD dihydroxybenzophenone, 1 part of Basonyl Blue 633 and 1 part of 2-(4-methylthiophenyl)-4,6-trichloromethyl-S-Triazine.

The formulation was coated onto a standard electrograined and anodized aluminium support as described in Example 3 and dried at 130° C. for 80 seconds to give a dry film weight of 1.5 g/m$^2$. The plate prepared was imaged using a Montakop UV lightframe using a TH 3020 diazo bulb supplied by Siegfried Theimer GmbH, of Germany. This emits UV radiation predominantly distributed in the wavelength band 400–440 nm. The plate was developed by immersion in a suitable aqueous developer solution for an appropriate time. It was found to ink up with UV ink and be usable as a UV printing plate. After printing, the UV ink was washed off the plate using C5060 blanket wash. This did not appear to remove image areas. The plate was subsequently again inked up using UV ink and found to print satisfactorily.

EXAMPLE 5, 6 AND COMPARATIVE EXAMPLE C1

Preparation of Thermally-imageable Positive-working Formulation

Formulations were prepared by mixing together the components described in the table below in 1-methoxy propan-2-ol (21% solids). The formulations were then coated at 2.5 g/m$^2$ onto a standard electrograined and anodized support as described in Example 3, followed by drying at 100° C. for 3 minutes.

| Components | Example 5 (wt %) | Example 6 (wt %) | Example C1 (wt %) |
| --- | --- | --- | --- |
| LB6564 Resin | 66.5 | 66.5 | 70.0 |
| LB744 Resin | 19.0 | 19.0 | 20.0 |
| KF654B PINA | 2.0 | 2.0 | 2.0 |
| Crystal Violet | 2.0 | 2.0 | 2.0 |
| Silikophen P5OX | 6.0 | 6.0 | 6.0 |
| Compound 8 | 4.5 | — | — |
| Compound 9 | — | 4.5 | — |

EXAMPLE 7

Testing of Formulations

Samples coated with the formulations of Examples 5, 6 and C1 were tested in two types of fount test, as follows:

Test 1

10 cm×10 cm plate samples were initially weighed and were then submersed in a 25 wt % aqueous iso-propyl alcohol solution for 24 hours followed by rubbing with cotton wool to remove loosely bound coating. After drying, the samples was re-weighed and the % weight loss calculated.

Test 2

5 cm×10 cm plate samples were immersed in a 10 wt % alcohol replacement fount solution (Emerald Euro S4) and the condition of the samples examined after 24 hours to assess whether the formulation was stripped from the sample.

Results of Test 1 and 2 are provided in the table below.

| Example No. | Test 1 | Test 2 |
| --- | --- | --- |
| 5 | 80% | No stripping observed |
| 6 | 80% | No stripping observed |
| C1 | 100% | Complete stripping |

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A lithographic printing plate precursor which includes a polymeric compound having the structural unit

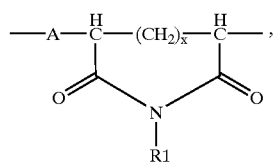

III wherein $R^1$ represents an optionally substituted cyclic or alkyl group, x represents 0 or 1, and (i) A represents an optionally-substituted alkylene group, or (ii) A is of general formula —$CHR^4CH_2$— wherein $R^4$ represents a hydrogen or halogen atom, a hydroxy group or an optionally-substituted alkyl, alkoxy, or phenyl group.

2. A precursor according to claim 1, wherein x represents 0.

3. A precursor according to claim 1, wherein optional substituents of group $R^1$ are selected from hydroxy; optionally-substituted alkoxy, hydroxyalkoxy and —$SO_2NR^2R^3$ groups, where $R^2$ and $R^3$ independently represent a hydrogen atom or an alkyl group; functional groups containing a radiation sensitive atom or group; functional groups which increase the heat sensitivity of said polymeric compound prepared in the process; dye-containing groups; groups which include an ethylenically-unsaturated double bond, and groups that may aid the adhesion of said polymeric compound prepared in the process to a substrate.

4. A precursor according to claim 3, wherein optional substitutents of group $R^1$ are selected from hydroxy and optionally-substituted alkoxy, hydroxyalkyl and —$SO_2NR^2R^3$ groups.

5. A precursor according to claim 1, wherein said polymeric compound having structural unit I is optionally derivatized by reaction with a compound containing a radiation sensitive atom or group; functional groups which increase the heat sensitivity of said polymeric compound prepared in the process; a dye containing group; a group which includes an ethylenically unsaturated double bond; or a group that may aid the adhesion of said polymeric compound prepared in the process to a substrate of a printing member.

6. A precursor according to claim 1, wherein said polymeric compound having structural unit I is provided in a first layer which is a radiation layer, a heat sensitive layer, or a combination thereof, which is arranged to be imagewise exposed to radiation, heat, or a combination thereof followed by optional development, to provide ink-accepting and non-ink-accepting areas.

7. A precursor according to claim 6, including 20 wt % to 70 wt % of polymeric compounds having the structural unit I.

8. A precursor according to claim 6, including less than 20 wt % of polymeric compounds having the structural unit I.

9. A process for the preparation of a polymeric compound having the structural unit

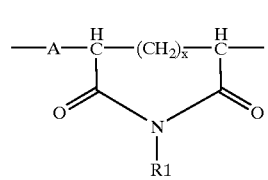

III for a printing member precursor, the process including the step of selecting an amine of formula $R'NH_2$ to give when reacted with a polymeric compound having the structural unit

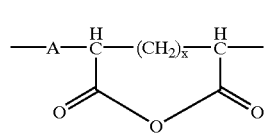

IV followed by optional derivatization, the desired resistance to a solvent used in printing; treating said compound having the structural unit IV with said amine to yield a compound having the structural unit III; and optionally derivatizing said compound having the structural unit III to yield another compound of structural unit III, wherein $R^1$ represents an optionally substituted cyclic or alkyl group, x represents 0 or 1, and (i) A represents an optionally-substituted alkylene group, or (ii) A is of general formula —$CHR^4CH_2$— wherein $R^4$ represents a hydrogen or halogen atom, a hydroxy group or an optionally-substituted alkyl, alkoxy, or phenyl group.

10. A polymeric compound having the structural unit

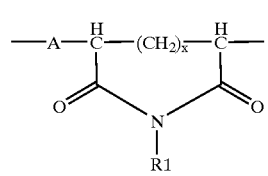

III wherein $R^1$ represents an optionally substituted cyclic or alkyl group and x represents 0 or 1, and (i) A represents an optionally-substituted alkylene group, or (ii) A is of general formula —$CHR^4CH_2$ — wherein $R^4$ represents a hydrogen or halogen atom, a hydroxy group or an optionally-substituted alkyl, alkoxy, or phenyl group.

11. A printing member having printing and non-printing areas wherein said printing areas include a first layer which includes a polymeric compound having the structural unit

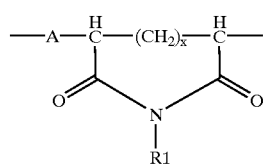
III
wherein $R^1$ represents an optionally substituted cyclic or alkyl group and x represents 0 or 1, and (i) A represents an optionally-substituted alkylene group, or (ii) A is of general formula —$CHR^4CH_2$— wherein $R^4$ represents a hydrogen or halogen atom, a hydroxy group or an optionally-substituted alkyl, alkoxy, or phenyl group.
\* \* \* \* \*